United States Patent [19]
Akylas et al.

[11] Patent Number: 5,302,491
[45] Date of Patent: Apr. 12, 1994

[54] METHOD OF ENCODING IDENTIFICATION INFORMATION ON CIRCUIT DICE USING STEP AND REPEAT LITHOGRAPHY

[75] Inventors: Victor R. Akylas, San Jose; Charles Seaborg, Fremont, both of Calif.

[73] Assignee: North American Philips Corporation, New York, N.Y.

[21] Appl. No.: 93,446

[22] Filed: Jul. 19, 1993

Related U.S. Application Data

[63] Continuation of Ser. No. 750,746, Aug. 21, 1991, abandoned, which is a continuation of Ser. No. 453,544, Dec. 20, 1989, abandoned.

[51] Int. Cl.$^5$ .................................................. G03C 5/00
[52] U.S. Cl. ...................................... 430/311; 430/313; 430/322; 430/394; 437/229
[58] Field of Search .............. 430/311, 312, 313, 322, 430/394; 437/229

[56] References Cited

U.S. PATENT DOCUMENTS 4,409,686 10/1983 Ports et al. .......................... 382/8
4,869,998 9/1989 Eccles et al. ....................... 430/22

FOREIGN PATENT DOCUMENTS 0057645 8/1982 European Pat. Off. .

Primary Examiner—Marion E. McCamish
Assistant Examiner—S. Rosasco
Attorney, Agent, or Firm—Leroy Eason

[57] ABSTRACT

A method is disclosed whereby identification information can be encoded onto a plurality of circuit dice on a wafer to enable each of them to be distinguished from one another. An array of electrically readable identification elements, such as resistors, is disposed on each of the circuit dice during the circuit fabrication process. A first mask is then positioned over the each of the dice which completely covers all but the identification elements. A step and repeat mask is then selectively positioned over a particular element or elements in the array which identify a circuit die by its location on the wafer. The die is then exposed using a conventional step and repeat photolithographic process so that only the selected identification element or elements in the array will remain. The second mask is then stepped over the next circuit die on the wafer but is positioned over a different identification element or elements in the array. This process is repeated for all of the circuit dice on the wafer so that different identification elements remain for each circuit die to distinguish them from one another. Using the step and repeat process in this manner eliminates the necessity for individually coding the identification information into each of the circuit dice.

12 Claims, 4 Drawing Sheets 5,302,491

METHOD OF ENCODING IDENTIFICATION INFORMATION ON CIRCUIT DICE USING STEP AND REPEAT LITHOGRAPHY

This is a continuation of application Ser. No. 07/750,746, filed Aug. 21, 1991, now abandoned which is a continuation of application Ser. No. 07/453,544, filed Dec. 20, 1989, now abandoned.

BACKGROUND OF THE INVENTION

The present invention relates in general to a method for encoding identification, serialization, or other information on circuit dice during fabrication.

There is a need for providing identification and other types of information on circuit dice or chips. For example, it may be desireable or necessary in circuit parameter studies to monitor small shifts in the values of the various circuit parameters of a test die over time. In order to observe such shifts accurately, a particular test circuit die must be used for each measurement because the variation of the circuit parameters from die to die may be comparable to, or even larger than, the shifts that are to be monitored. Consequently, some means must be provided by which a particular circuit die can be identified. The use of visible or optically readable marks and codes is not generally suitable because the dice are encapsulated so that the marks or codes can not be seen. As a consequence, electrical identification of the dice is the only workable solution, especially for large volumes of parts processed in production, assembly and test facilities. The only other alternative is to maintain part identification with physical means, such as part carriers or identification bins, however, this solution is unworkable with large numbers of parts and the risk of misclassification is unacceptably high.

In technologies in which there are inherently built-in programmable structures, such as programmable memories, it is a rather straight forward procedure to use these available structures for encoding the identification information into the circuits. However, with other types of circuits that do not include any programmable structures, extra undesirable or even impossible fabrication steps are required to add them which could have an effect on the measured circuit parameters that would defeat the whole purpose of the parameter study. What is needed is a simple method for incorporating identification information into a circuit die during the fabricating of the die.

SUMMARY OF THE INVENTION

It is therefore the object of the present invention to provide a method for fabricating circuit dice in which electrically detectable identification information is incorporated into each of the dice during the fabrication process without any programming operations, or incompatible fabrication steps.

This and other objects of the invention are achieved by providing an array of electrically readable elements, such as polysilicon resistors, on each of the circuit dice, and then selectively removing different ones of the elements on each of the dice for identification purposes. A conventional step and repeat lithographic process is utilized for this purpose, and it is arranged so that as each circuit die on a semiconductor wafer is exposed thereby, a step and repeat mask will shift just enough so that a different element in the array will be left unexposed on each of the dice on the wafer. In this manner, all of the dice on the wafer can be differentiated from each other by the identification elements which differs for each die. In one preferred embodiment of the invention, the element in the array that is left unexposed on each die corresponds with the position of the die on the wafer. Any conventional electrical sensing means can be then employed to sense or detect the presence of the identification element. A multiplexing circuit can be employed to check each of the element locations in the array quickly.

BRIEF DESCRIPTION OF THE DRAWINGS

The foregoing and additional objects, features and advantages of the present invention will become apparent from a consideration of the following detailed description of the preferred embodiments thereof taken in conjunction with the accompanying drawings in which.

DETAILED DESCRIPTION OF THE PREFERRED EMBODIMENTS

Figure 1:
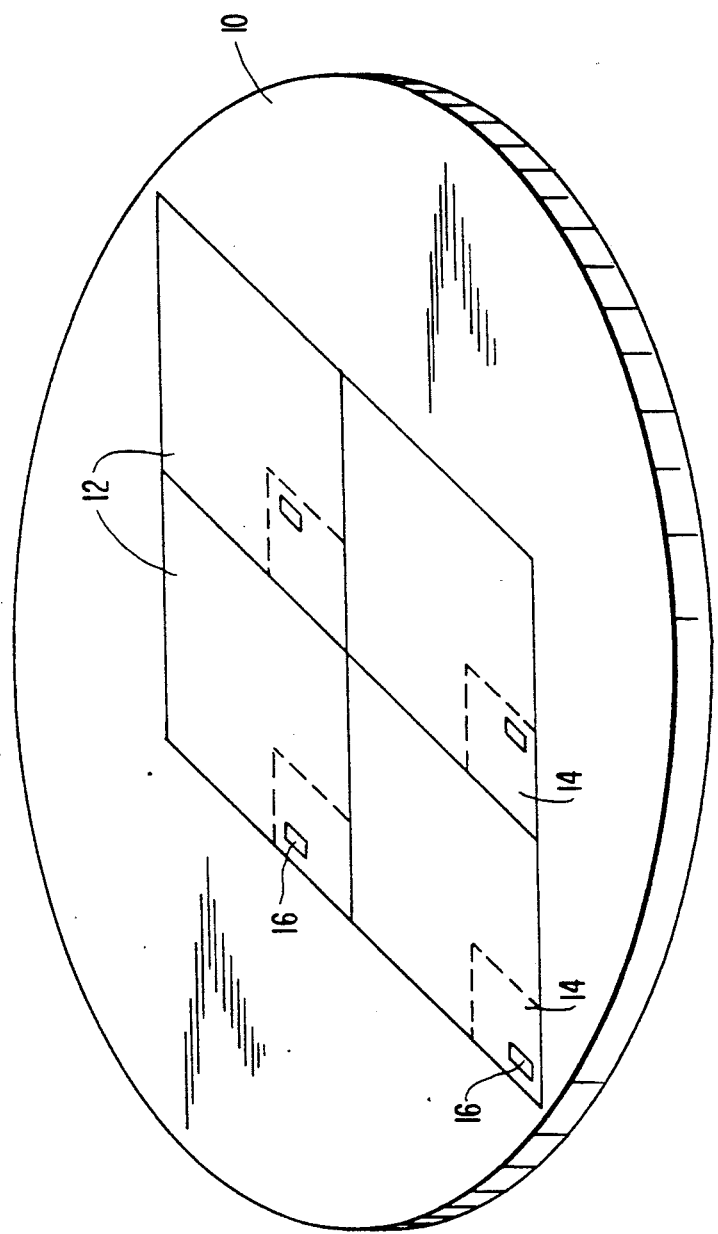
FIG. 1 is a perspective illustration of a semiconductor wafer with a plurality of circuit dice formed thereon.

Turning now to a more detailed consideration of the present invention, there is illustrated in FIG. 1, a semiconductor wafer 10 on which are formed a plurality of circuit dice 12. Although only four dice are illustrated in FIG. 1 for convenience, it will be understood that a considerably greater number of circuit dice could be formed in the wafer 10 as is conventional in the art. Disposed in the lower left corner of each of the dice 12 is an identification element array area 14 as illustrated by the dashed lines in FIG. 1. The array area 14 contains a number of identification elements 16, each of which corresponds to one of the circuit dice 12 on the wafer 10. The elements 16 can be any suitable electrically readable elements, such as polysilicon resistors, for example. During the fabrication of the circuit dice 12, only one identification element 16 remains on each of the circuit dice 12 and that element is disposed in the array area 14 at a position which corresponds to the position of the circuit die 12 on the wafer 10. As a result, each of the circuit dice 12 has a unique identification element 16 which can be employed to distinguish the circuit dice 12 from one another electrically.

Figure 2C:
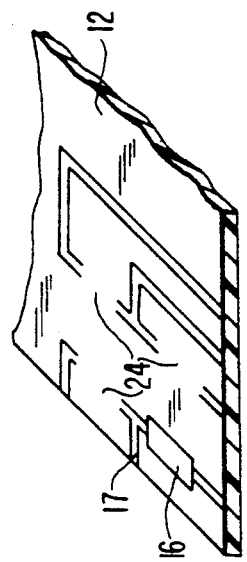
FIGS. 2A-C are partial perspective illustrations of portions of the circuit dice showing the fabrication steps by which an identification element is formed on each circuit die; and, FIG. 3 is a schematic block diagram of a circuit for sensing the presence or absence of identification elements on a circuit die.
Figure 2A:
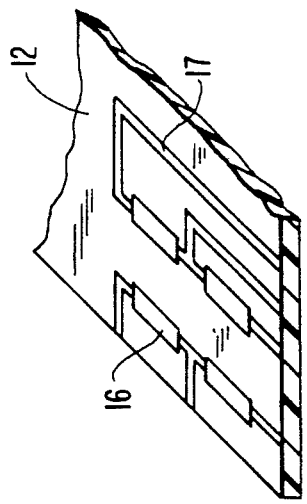
Figure 2B:
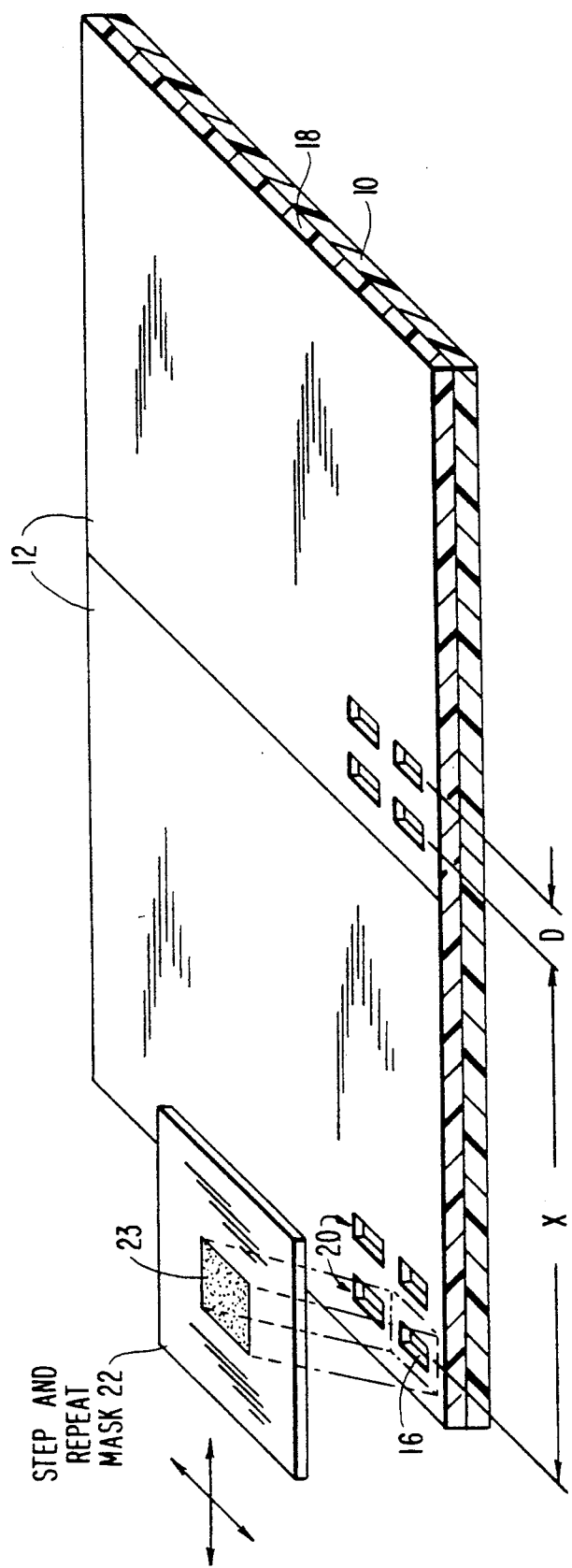

Turning now to FIGS. 2A-C, the method by which the identification elements 16 are formed on each of the circuit dice 12 is illustrated. With reference to FIG. 2A, the first step is to form the circuit patterns, including all of the identification elements 16 and a plurality of associated lead lines 17, on each of the circuit dice 12 by using conventional photolithographic techniques. As illustrated in FIG. 2B, the finished circuits are then covered with a photoresist mask 18 which includes a plurality of openings 20 for each of the identification resistors 16. A step and repeat mask 22 is then positioned above the photoresist mask 18 so that a dark area 23 on the mask 22 shields the opening 20 which corresponds to the identification element 16 that is to remain on each of the circuit dice 12.

Step and repeat photolithography is then employed to expose and remove each of the unmasked identification elements 16 from the circuit dice 12. Each exposure step exposes the identification elements on one of the circuit dice 12. After this, the step and repeat mask 22 is stepped a distance equal to the width of the circuit die 12 as denoted by X in FIG. 2B plus the distance D between adjacent identification elements 16. In this manner, the step and repeat mask 22 will be positioned above a different element 16 for each of the circuit dice 12 so that a different identification element 16 will remain on each of the dice 12 after the step and repeat photolithographic process is completed. The final step is to remove the photoresist mask 18 as is conventional in the art thereby leaving the circuits as shown in FIG. 2C with a plurality of open spaces 24 where the removed elements used to be. Any suitable technique is then employed to determine the location of the identification resistor 16 on each of the circuit dice 12 and thereby distinguish each of the circuit dice from each other.

Figure 3:
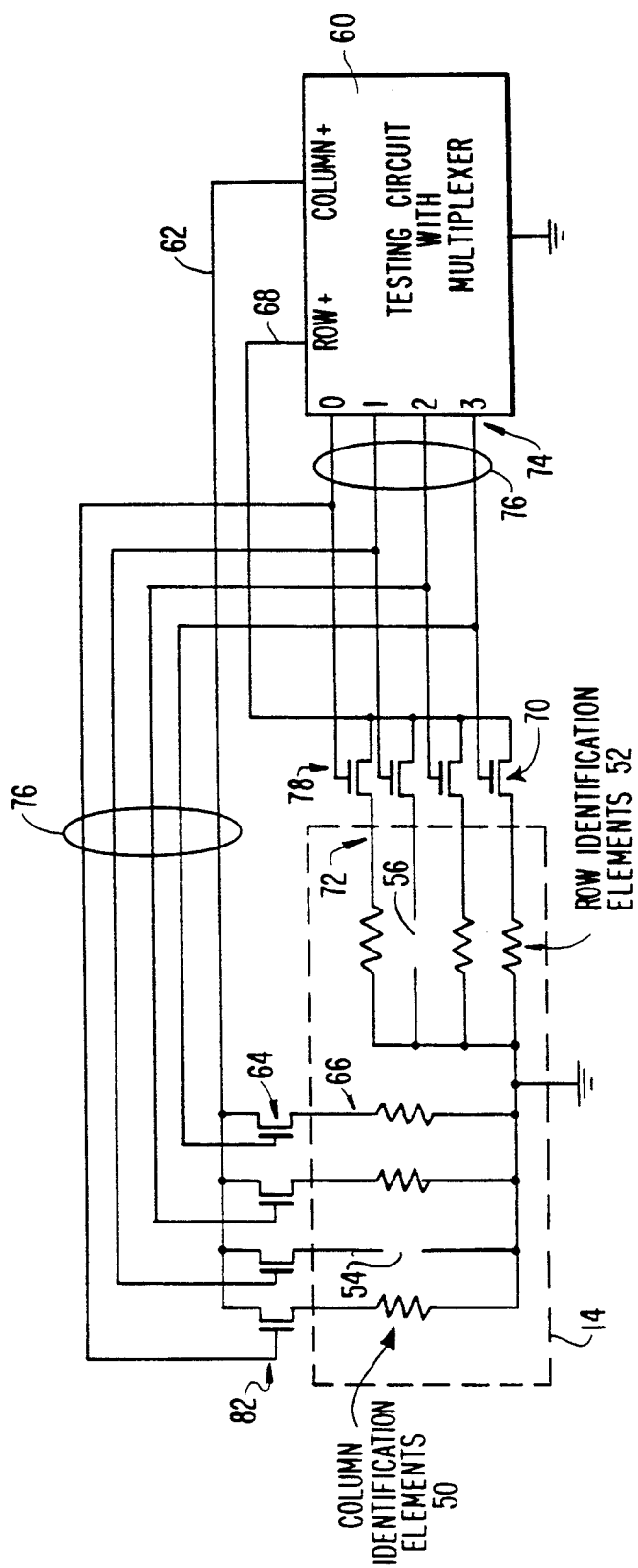

Turning now to FIG. 3, there is illustrated an example of a circuit for determining the identification of a circuit die by electrically testing for the presence or absence of identification elements on the circuit die. In particular, a variation on the identification elements of FIGS. 1-2 is illustrated in which, a plurality of column identification elements 50 and row identification elements 52 are disposed on each circuit die within the identification element array area 14 as illustrated by the dashed lines in FIG. 3. Each circuit die on a wafer is identified by its column and row position on the wafer through use of the column identification elements 50 and the row identification elements 52, respectively. In the example shown in FIG. 3, a first open circuit 54 is formed in the second of the plurality of column identification elements 50 to indicate that the circuit die was positioned in the second column of dice on the wafer. Similarly, a second open circuit 56 is formed in the second of the plurality of row identification elements 52 to indicate that the circuit die was positioned in the second row of dice on the wafer. It should be noted that in this embodiment, the absence of an identification element identifies the circuit die in contrast to the embodiment of FIG. 1, in which the presence of an identification element identifies the circuit die.

A testing circuit 60 is connected to the column and row identification elements 50 and 52 to apply a test voltage to each of the elements sequentially with a conventional multiplexer circuit. The testing circuit 60 applies a positive voltage through a first output line 62 to a first plurality of FET type gates 64. The gates 64 are in turn connected through a plurality of lines 66 to the column identification elements 50. Similarly, a second output 68 of testing circuit 60 supplies a positive voltage selectively to a second plurality of FET type gates 70, which in turn are connected through a plurality of lines 72 to the row identification elements 52.

A plurality of multiplexer outputs 74 of testing circuit 60 are connected through a plurality of lines 76 to a plurality of corresponding gate electrodes 78 on each of the first plurality of FET gates 64, and to a corresponding plurality of gate electrodes 78 of the second plurality of FET gates 70. In the operation of the circuit of FIG. 3, voltage is first supplied to the column identification elements 50 and the gate electrodes of the FET gates 64 are sequentially enabled by the multiplexer so that the testing circuit can determine if current flows through each of the column identification elements 50. In the example illustrated in FIG. 3, no current will flow through the second column identification element and the testing circuit will therefore be able to determine that the circuit die under test was positioned in column 2 on the wafer. Similarly, voltage is then supplied to the row identification elements 52 and the gates of the FET gate electrodes 70 are sequentially enabled by the multiplexer so that the testing circuit 60 can determine the identification of the missing row identification element. In this example, the testing circuit 60 will determine that the circuit die under test was positioned in the second row and second column of the wafer.

Although the invention has been disclosed in terms of preferred embodiments, it will be understood that numerous variations and modifications could be made thereto without departing from the true spirit and scope of the invention as defined by the following claims.

What is claimed is:

1. A method whereby formation of a predetermined circuit pattern on each of a plurality o circuit dies of a semiconductor wafer is accompanied by inclusion on each die of electrically detectable information for identifying said die, the dies all having the same rectangular dimensions and being in rectangular array in successive rows and columns; said method comprising the steps of:

(a) forming on each of said dies in succession, by step-and-repeat lithography, said predetermined circuit pattern and a rectangular array of identical electrically detectable identification elements, said array constituting an identification array which is the same and at the same position on each die, the identification elements therein being in successive rows and columns analogous to the rows and columns of said die array, adjoining identification elements all having the same pitch distance (D); the step-and-repeat lithography including positioning a first photomask over the die in a first column of a first row of the die array and subsequently successively repositioning the first photomask over each successive die in successive columns of successive rows of the die array, each said repositioning being by stepping the first photomask a stepping distance (W) from a present position thereof;

(b) modifying the identification array on each die so as to select, by retention or removable, one of the identification elements therein; the position of the selected identification element in the identification array on any particular die constituting electrically detectable information for identifying said die; said modification being performed by the steps of:

(i) forming a photosensitive resist on the identification arrays on all dies;

(ii) providing a second photomask having an aperture therein of dimensions matching corresponding dimensions of each identification element;

(iii) positioning the second photomask over the die in a first column of a first row of the die array so that the aperture in the second photomask registers with the identification element in a first column of a first row of the identification array on said die;

(iv) successively repositioning the second photomask over the identification array on each succeeding die in successive columns of successive rows of said die array, each said repositioning being by stepping the second photomask said stepping distance (W) augmented by said pitch distance (D), so that at each step the aperture in the second photomask registers with the identification element in a row and column of the identification array on the next succeeding die which corresponds to the row and column of said next succeeding die in the die array;

(v) during each of steps (iii) and (iv), subjecting the second photomask to radiation while the aperture therein is registered with an identification element, thereby photolithographically modifying the area of the photosensitive resist overlying said registered identification element; and (vi) after completion of steps (iv) and (v) for all dies, developing said photosensitive resist so as to pattern it in accordance with the modified areas thereof, and using the patterned resist to select, by retention or removal, only those of the identification elements on which the modified areas of said resist had been formed;

whereby the identification array on each die is modified so that position of the selected identification element therein constitutes electrically detectable information for identifying such die.

2. A method as claimed in claim 1, wherein in step (b) and in sub-step (vi) thereof the selected identification element on each die is retained and all other identification elements in the identification array on such die are removed.

3. A method as claimed in claim 2, wherein the identification elements are resistors.

4. A method as claimed in claim 1, wherein in step (b) and in sub-step (vi) thereof, the selected identification element on each die is removed and all other identification elements in the identification array on such die are retained.

5. A method as claimed in claim 4, wherein the identification elements are resistors.

6. A process as claimed in claim 1, wherein the identification elements are resistors.

7. A method as claimed in claim 6, wherein in step (b) and sub-step (vi) thereof the selected identification elements on each die are removed and all other identification elements in the identification array on such die are retained.

8. A method as claimed in claim 7, wherein the identification elements are resistors.

9. A method as claimed in claim 6, wherein in step (b) and in sub-step (vi) thereof the selected identification elements on each die are retained and all other identification elements in the identification array on such die are removed.

10. A method as claimed in claim 15, wherein the identification elements are resistors.

11. A method whereby formation of a predetermined circuit pattern on each of a plurality of circuit dies of a semiconductor wafer is accompanied by inclusion on each die of electrically detectable information for identifying said die, the dies all having the same rectangular dimensions and being in rectangular array in successive rows and columns; said method comprising the steps of:

(a) forming on each of said dies in succession, by step-and-repeat lithography, said predetermined circuit pattern and a rectangular array of identical electrically detectable identification elements, said array constituting an identification array which is the same and at the same position on each die, the identification elements therein respectively being in respective rows and respective columns corresponding to respective rows and respective columns of said die array, identification elements in adjoining rows and identification elements in adjoining columns all having the same pitch distance (V); the step-and-repeat lithography including positioning a first photomask over the die in a first column and first row of the die array and subsequently successively repositioning the first photomask over each successive die in successive columns of successive rows of the die array, each said repositioning being by stepping the first photomask a stepping distance (W) from a present position thereof;

(b) modifying the identification array on each die so as to select, by retention or removable, an identification element in a row of said array and an identification in a column of said array, the positions of the selected row and column identification elements in the identification array on any particular die constituting electrically detectable information uniquely identifying said die, said modification being performed by the steps of:

(i) forming a photosensitive resist on the identification arrays on all dies;

(ii) providing a second photomask having a row aperture therein and a column aperture therein each of dimensions matching the corresponding dimensions of each identification element;

(iii) positioning the second photomask over the die in a first column of a first row of the die array so that the row aperture in the second photomask registers with the identification element in a first row of the identification array on said die and the column aperture in the second photomask registers with the identification element in a first column of the identification array on said die;

(iv) successively repositioning the second photomask over the identification array on each next succeeding die in successive columns of successive rows of said die array, each said repositioning being performed by stepping the second photomask said stepping distance (W) augmented by said pitch distance (D), so that at each step the row and column apertures in the second photomask respectively register with identification elements respectively in a row and column of the identification array on the next succeeding die which correspond to the row and column of said next succeeding die in said die array;

(v) during each of steps (iii) and (iv), subjecting the second photomask to radiation while the apertures therein are registered with identification elements, thereby photolithographically modifying the areas of the photosensitive resist overlying said registered identification elements; and (vi) after completion of steps (iv) and (v) for all dies, developing said photosensitive resist so as to pattern it in accordance with the modified areas thereof, and using the patterned resist to select, by retention or removal, only those of the identification elements on which the modified areas of said resist had been formed;

whereby the identification array on each die is modified so that the positions of the selected identification elements therein constitute electrically detectable information for identifying such die.

12. A method as claimed in claim 11, wherein the identification elements are resistors.

* * * * *